(12) United States Patent
Cosley et al.

(10) Patent No.: US 8,456,806 B2
(45) Date of Patent: Jun. 4, 2013

(54) PANELBOARD ENCLOSURE WITH MANUALLY OPERABLE LOAD DISCONNECTOR

(75) Inventors: Michael R. Cosley, Crystal Lake, IL (US); Aron J. King, Alden, NY (US); David H. Halik, Cheektowaga, NY (US)

(73) Assignee: Diversified Control, Inc., Orchard Park, NY (US)

( * ) Notice: Subject to any disclaimer, the term of this patent is extended or adjusted under 35 U.S.C. 154(b) by 225 days.

(21) Appl. No.: 12/987,100

(22) Filed: Jan. 8, 2011

(65) Prior Publication Data

US 2012/0176732 A1    Jul. 12, 2012

(51) Int. Cl.
*H02B 1/38* (2006.01)

(52) U.S. Cl.
USPC ........... 361/622; 361/601; 361/605; 361/634; 361/640; 361/643; 307/64; 307/65; 307/66; 307/70; 307/80

(58) Field of Classification Search
USPC ...................... 361/601, 605, 622–627 M, 634, 361/640–648, 724–728; 307/64, 66, 80, 82, 307/85, 113, 131, 140, 147, 125; 312/213, 312/223.2, 223.3, 265.6; 174/50, 58, 59, 174/17 R, 520; 363/56.1, 142–146; 200/50.32, 200/50.33, 50.4
See application file for complete search history.

(56) References Cited

U.S. PATENT DOCUMENTS

| | | | |
|---|---|---|---|
| 3,778,633 A * | 12/1973 | DeVisser et al. ................ 307/64 |
| 4,270,031 A | 5/1981 | Borona et al. | |
| 4,812,672 A | 3/1989 | Cowan et al. | |
| 5,136,463 A * | 8/1992 | Webster ........................ 361/622 |
| 5,233,511 A * | 8/1993 | Bilas et al. ...................... 700/17 |
| 5,260,605 A | 11/1993 | Barfield | |
| 5,393,942 A * | 2/1995 | Reiner et al. .................. 200/50.4 |
| 5,577,603 A | 11/1996 | Bogdanovs et al. | |
| 5,612,581 A * | 3/1997 | Kageyama ...................... 307/64 |
| 5,648,646 A | 7/1997 | Flegel | |
| 5,670,936 A * | 9/1997 | Estes et al. ..................... 340/501 |
| 5,781,410 A * | 7/1998 | Keown et al. .................. 361/690 |
| 5,963,420 A | 10/1999 | Bailey et al. | |
| 5,977,492 A | 11/1999 | Taylor et al. | |
| 5,982,652 A * | 11/1999 | Simonelli et al. ............. 363/142 |

(Continued)

OTHER PUBLICATIONS

CIPO, First Canadian Examination Report in Counterpart Application, Canadian Application No. 2,731,586 for "Panelboard Enclosure With Manually Operable Load Disconnector", Jul. 23, 2012, 2 pages.

(Continued)

*Primary Examiner* — Michail V Datskovskiy
(74) *Attorney, Agent, or Firm* — Walter W. Duft (57) ABSTRACT

An electrical panelboard enclosure includes an enclosure housing with an interior equipment chamber accessible by way of a service entrance door. A service panel is adapted for connection to a main power source in order to receive main power therefrom. A power supply is operatively connected to receive main power from the service panel and deliver it to a load. The power supply is also adapted for connection to a backup power source in order to receive backup power therefrom and deliver it to the load in the event of a main power cutoff. A load disconnector is operatively connected between the power supply and the load. The load disconnector is manually operable to disconnect the load from the power supply to prevent the power supply from delivering either main or backup power to the load.

22 Claims, 9 Drawing Sheets

U.S. PATENT DOCUMENTS

| | | | |
|---|---|---|---|
| 6,031,193 | A | 2/2000 | Flegel |
| 6,069,328 | A | 5/2000 | Oravetz |
| 6,157,168 | A * | 12/2000 | Malik ............... 320/128 |
| 6,184,595 | B1 | 2/2001 | Flegel, Jr. |
| 6,476,519 | B1 | 11/2002 | Weiner |
| 6,521,849 | B1 | 2/2003 | Flegel |
| 6,534,735 | B1 | 3/2003 | Czarnecki |
| 6,541,718 | B2 | 4/2003 | Burkholder et al. |
| 6,570,269 | B2 * | 5/2003 | McMillan et al. ............ 307/64 |
| 6,621,689 | B1 * | 9/2003 | Flegel ............... 361/631 |
| 6,657,320 | B1 * | 12/2003 | Andrews et al. ............ 307/64 |
| 6,696,969 | B2 | 2/2004 | Torrez et al. |
| 6,784,385 | B2 * | 8/2004 | Hernandez-Perez ...... 200/50.33 |
| 6,787,259 | B2 * | 9/2004 | Colborn et al. ............ 429/430 |
| 6,927,349 | B1 | 8/2005 | Flegel et al. |
| 6,932,443 | B1 * | 8/2005 | Kaplan et al. ............ 312/213 |
| 6,980,725 | B1 * | 12/2005 | Swieconek ............ 385/135 |
| 7,141,894 | B2 * | 11/2006 | Kraus ............... 307/65 |
| 7,142,950 | B2 * | 11/2006 | Rasmussen et al. ........ 700/286 |
| 7,155,320 | B2 * | 12/2006 | Gee ............... 700/295 |
| 7,239,045 | B2 * | 7/2007 | Lathrop et al. ............ 307/80 |
| 7,259,481 | B2 * | 8/2007 | Eaton et al. ............ 307/125 |
| 7,339,353 | B1 * | 3/2008 | Masias et al. ............ 320/138 |
| 7,348,769 | B2 | 3/2008 | Ramirez |
| 7,418,314 | B2 * | 8/2008 | Rasmussen et al. ........ 700/286 |
| 7,462,954 | B2 * | 12/2008 | Kraus ............... 307/64 |
| 7,514,815 | B2 * | 4/2009 | Paik et al. ............ 307/64 |
| 7,545,285 | B2 | 6/2009 | Shuey et al. |
| 7,561,017 | B2 | 7/2009 | Darr et al. |
| 7,599,171 | B1 * | 10/2009 | Remmert ............ 361/631 |
| 7,616,432 | B2 | 11/2009 | Luebke et al. |
| 7,816,602 | B2 * | 10/2010 | Landry et al. ............ 174/50 |
| 7,855,871 | B2 * | 12/2010 | Hudgins et al. ............ 361/624 |
| 7,864,509 | B1 * | 1/2011 | Remmert ............ 361/631 |
| 8,254,089 | B2 * | 8/2012 | Cosley et al. ............ 361/640 |
| 2002/0125115 | A1 | 9/2002 | Burkholder et al. |
| 2004/0150374 | A1 * | 8/2004 | Kraus ............... 322/4 |
| 2005/0278075 | A1 * | 12/2005 | Rasmussen et al. ........ 700/286 |
| 2006/0158037 | A1 * | 7/2006 | Danley et al. ............ 307/64 |
| 2006/0202559 | A1 * | 9/2006 | Hashimoto et al. ............ 307/64 |
| 2009/0046415 | A1 * | 2/2009 | Rasmussen et al. ........ 361/644 |
| 2009/0073641 | A1 * | 3/2009 | Ross ............... 361/626 |
| 2010/0208433 | A1 * | 8/2010 | Heimann et al. ............ 361/724 |
| 2010/0290604 | A1 * | 11/2010 | Wright et al. ............ 379/102.04 |
| 2010/0290605 | A1 * | 11/2010 | Wright et al. ............ 379/102.04 |

OTHER PUBLICATIONS

NBOX, "NBOX Cabinet Model 200", Jan. 1, 2009, 2 pages.
ELTEK "Quick Start Guide Installation, Operation, Commissioning and Maintenance Minipack, PS System", Dec. 29, 2006, 32 pages.
C&C Power, Inc., "Battery Disconnects", Jan. 1, 2001, 2 pages.
Unipower Telecom, "Operating Manual Low-Voltage Disconnect Panels LVD400 & LVD600 Series", Jan. 1, 2001, 13 pages.
Electric Equipment & Engineering Co., "200A, 120/240V, 1 Phase TSM With TWS Surge Protection and GFI in 3R Cabinet", Apr. 6, 2009, 1 page.
AC Data Solutions, "ILC Series Integrated Load Center Solutions", Feb. 20, 2007, 2 pages.
Emerson Network Power, "JuiceBox Power Transfer Switch (PTS)", Jan. 1, 2006, pp. 1-6.
Pantrol, "Innovattive Power Solutions", Jan. 1, 2009, 22 pages.
Gentran Corporation, "Power Centers", May 21, 2008, 2 pages.
Square D, "Class 9421, Type FP-1 Door Mounted Operating Mechanism for Use With Square D Type KA Circuit Breaker", Apr. 1, 1983, 1 page.
Square D, "Class 9421 Type L Door Mounted Operating Mechanisms for use with Square D Type KAL, KCL and KHL Circuit Breakers", Jan. 1, 1994, 8 pages.
Thomson Technology, "Automatic Transfer Switches", Aug. 5, 2001, 4 pages.
AC Data Solutions, "Power Protection Cabinet (PPC)", Jul. 2, 2007, 2 pages.
AC Data Solutions, "Panel One Series ILC Integrated Load Center Solutions", Feb. 29, 2007, 2 pages.
AC Data Solutions, "GenLox Alternate Power Connection Integrated Load Center & Shelter Solutions", Jun. 23, 2008, 2 pages.
Electric Equipment & Engineering Co., "Panel One Integrated Load Center", Feb. 29, 2007, 21 pages.
Square D, "Operating Mechanisms, Disconnect Switches, and Door-Closing Mechanisms Selection Guide", Dec. 1, 1997, 44 pages.
Siemens, "General Duty 240 Volt, Type 1 (Indoor)", Jan. 1, 2002, 1 page.
Siemens, "Siemens Enclosed Rotary Disconnect Switches", Jan. 1, 2002, 2 pages.
Siemens, "Visible Blade Disconnect Switches", Jan. 1, 2008, 12 pages.
Cutler-Hammer, "Safety Switches", Jan. 1, 2007, 12 pages.
Ferraz Shawmut, "Enclosed Disconnect Switches", Jan. 1, 2007, 8 pages.
GE Industrial Systems, "IEC Disconnect Switches Selection Guide", Feb. 2, 2000, 6 pages.
Klockner Moeller, "Molded Case Circuit Breakers and Switches", Jan. 1, 2007, 2 pages.
Klockner Moeller, "Molded Case Circuit Breakers and Switches, 600 A, 600 V AC", Jan. 1, 2005, 2 pages.
Klockner Moeller, "Product Range Catalog | 2006 Switching, protection, communication—the new NZM-4 circuit-breaker series up to 1200 A", Aug. 1, 2006, 176 pages.
Aron J. King, "Declaration of Aron J. King Under 37 C.F.R. 1.56", Mar. 22, 2012, 26 pages.

* cited by examiner

PANELBOARD ENCLOSURE WITH MANUALLY OPERABLE LOAD DISCONNECTOR

BACKGROUND

1. Field of the Invention

The present invention relates to electrical panelboard enclosures, including but not limited to panelboard enclosures for powering outdoor communications equipment.

2. Description of the Prior Art

By way of background, electrical panelboard enclosures (also referred to as distribution boards, service panels, breaker panels, etc.) are used to distribute electrical power from a main power source to one or more subsidiary load circuits. In some panelboard enclosures, the one or more subsidiary load circuits may comprise onboard electronics powered by an onboard rectifying power supply that is capable of delivering rectified main power. This type of panelboard enclosure may be referred to an electronics enclosure. Some electronics enclosures provide the ability to supply backup power to the onboard electronics from a backup power source, such as batteries, following the loss of main power. It is to improvements in electrical panelboard enclosures, and particularly electronics enclosures equipped with a power supply, onboard electronics and a backup power source, that the present invention is directed.

SUMMARY

An electrical panelboard enclosure includes an enclosure housing with an interior equipment chamber accessible by way of a service entrance door. A service panel is adapted for connection to a main power source in order to receive main power therefrom. A power supply is operatively connected to receive main power from the service panel and deliver it to a load. The power supply is adapted for connection to a backup power source in order to receive backup power therefrom and deliver it to the load in the event of a main power cutoff. A load disconnector is operatively connected between the power supply and the load. The load disconnector is manually operable to disconnect the load from the power supply to prevent the power supply from delivering either main or backup power to the load.

According to example embodiments, the load disconnector may include a load disconnect switch selected from the group consisting of mechanical switches and sensors, optical switches and sensors, and proximity switches and sensors. The load disconnector may further include a load disconnect relay that is disposed in an electrical current pathway between the power supply and the load, and is controlled by the load disconnect switch. The load disconnector may also include a load disconnect actuating mechanism that is accessible from outside the enclosure housing. For example, the load disconnect actuating mechanism could be mounted on the service entrance door.

According to additional example embodiments, the panelboard enclosure may further include a main power breaker having a main power breaker toggle switch operable to selectively activate and deactivate the delivery of main power to the power supply. The main power breaker is positionable between a power-on state and a power-off state. The panelboard enclosure may further include a power cutoff switch mechanism operable from outside the service entrance door to mechanically engage and deactivate the main power breaker toggle switch and cutoff the main power without opening the service entrance door. The power cutoff switch mechanism is positionable between a power-on state and a power-off state. The load disconnector may be operated by the power cutoff switch mechanism to disconnect the load from the power supply when the power cutoff switch mechanism is positioned in the power-off state. The power cutoff switch mechanism may thus also serve as a load disconnect actuating mechanism.

BRIEF DESCRIPTION OF THE DRAWINGS

The foregoing and other features and advantages will be apparent from the following more particular description of example embodiments, as illustrated in the accompanying Drawings, in which.

DETAILED DESCRIPTION OF EXAMPLE EMBODIMENTS

Figure 1:
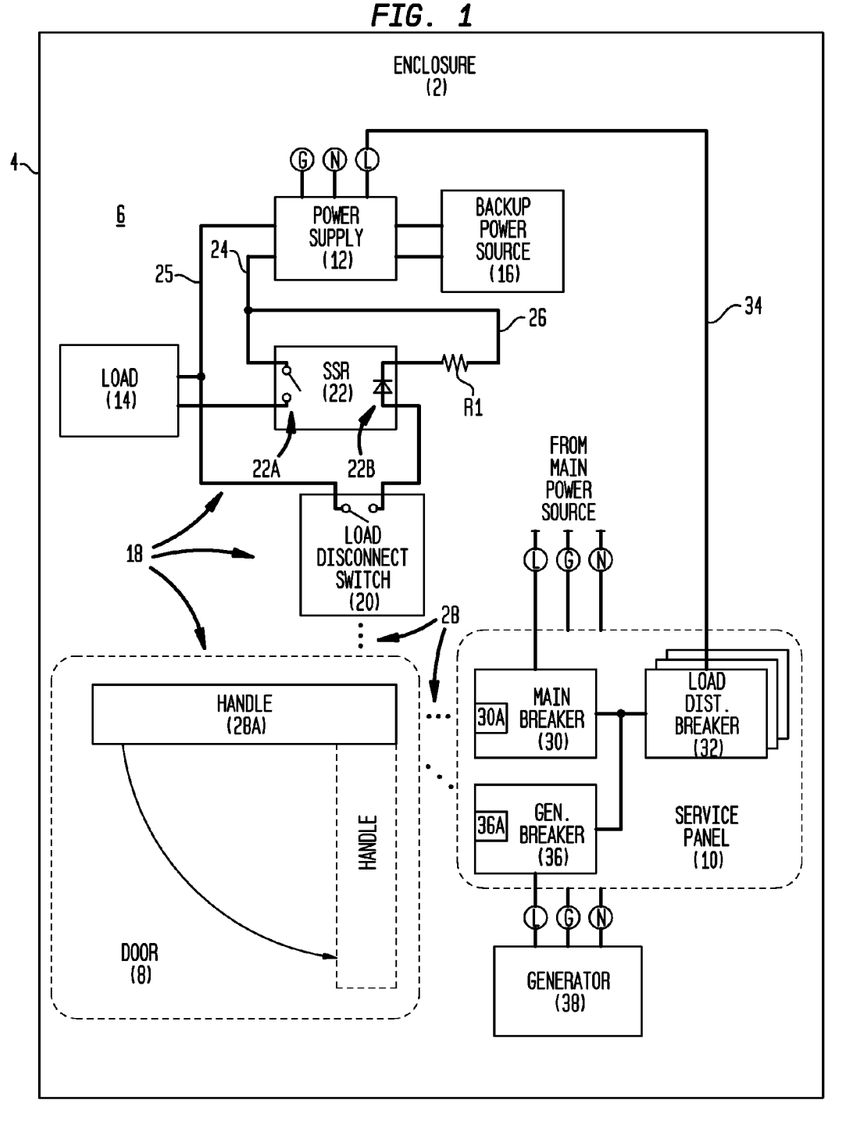
FIG. 1 is a functional block diagram showing functional components of an example panelboard enclosure according to the present disclosure.
Figure 1A:
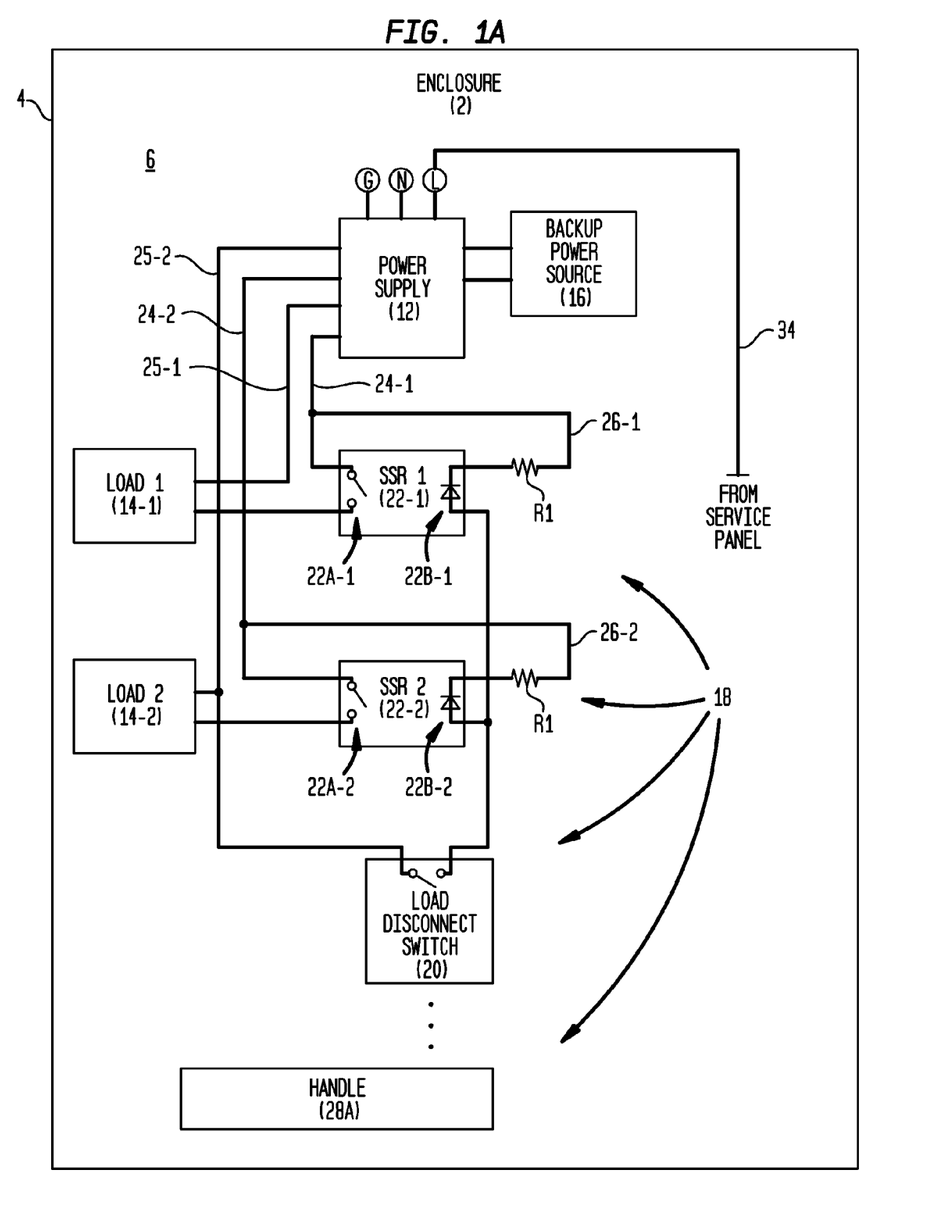
FIG. 1A is a functional block diagram showing a modification of the panelboard enclosure of FIG. 1.
Figure 1B:
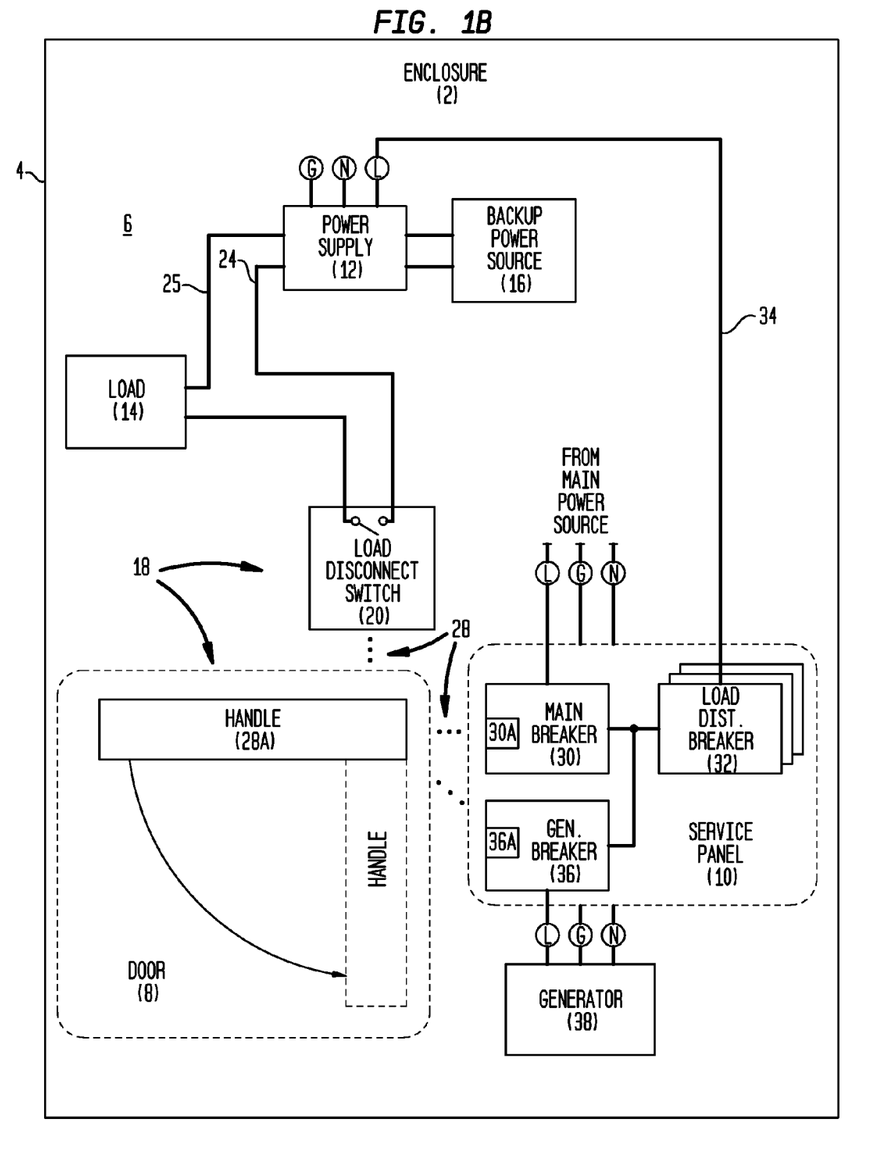
FIG. 1B is a functional block diagram showing a further modification of the panelboard enclosure of FIG. 1.

Turning now to the drawing figures, wherein like reference numerals are used to represent like elements in all of the several views, a panelboard enclosure (sometimes referred to as a panelboard) with manually operable load disconnect functionality will now be described in the context of several illustrated embodiments. By way of introduction, FIGS. 1, 1A and 1B represent functional block diagrams that will be discussed initially in order to acquaint the reader with the panelboard enclosure's basic load disconnect features. Thereafter, FIGS. 2-6B will be described to illustrate a working panelboard enclosure embodiment that may be constructed in accordance with the present disclosure.

In FIG. 1, a panelboard enclosure 2 includes an enclosure housing 4 with an interior equipment chamber 6 that is accessible by way of a service entrance door 8. A service panel 10 is adapted for connection to a main power source (not shown) in order to receive main power therefrom. FIG. 1 illustrates single-phase main power that includes Line (L), Neutral (N) and Ground (G) connections. Although not shown, three phase main power could also be used. A power supply 12 is operatively connected to receive main power from the service panel 10 and deliver it to a load 14 that may comprise one or more electronics systems or devices. The load 14 may be located within the equipment chamber 6, in which case the panelboard enclosure may also be referred to as an electronics enclosure. Alternatively, some or all of the devices that comprise the load 14 could be external to the enclosure housing 4. Typically, the load 14 will be a DC load and the power supply 12 will be a rectifying power supply that outputs DC power at the voltage level required by the one or more load systems or devices. The power supply 12 is also adapted for connection to a backup power source 16 in order to receive backup power therefrom and deliver it to the load 14 in the event of a main power cutoff. The backup power source 16 may be implemented using one or more batteries. It may be located within the equipment chamber 6 or in an alternative implementation could be external to the enclosure housing 4.

A load disconnector 18 is operatively connected between the power supply 12 and the load 14. The load disconnector 18 is manually operable to disconnect the load 14 from the power supply 12 in order to prevent the power supply from delivering either main or backup power to the load. Being able to disconnect the load 14 from backup power is especially advantageous because the power supply 12 will typically automatically deliver backup power from the backup power source 16 when the main power is cutoff. Thus, if a utility worker or a fire crew or other emergency service person shuts off main power in order to work in or around the enclosure housing 4, they will still be exposed to a live load unless the backup power can also be disconnected. The disconnector 18 serves that purpose.

As shown in FIG. 1, the load disconnector 18 may include a load disconnect switch 20 that can be manually actuated by service personnel from either inside or outside the enclosure housing 4 (as described in more detail below). The load disconnect switch 20 may be implemented using any of a multitude of switch or sensor technologies. These include, but not limited to, mechanical switches and sensors, optical switches and sensors, and proximity switches and sensors. Examples of mechanical switches and sensors include, but are not limited to, contact switches, micro-switches, capacitive and resistive sensors, and other switches and sensors that operate by way of physical contact. Examples of optical switches and sensors include, but are not limited to, opto-switches switches and light beam sensors that operate by detecting objects that influence a light transmission pathway. Opto-switches include slotted opto-switches that detect when an object is in a slot and reflective opto-switches that detect when a reflective object is nearby. Light beam sensors include sensors that operate by detecting an interruption in visible or infrared light send from a light source to a light receiver. Examples of proximity sensors include, but are not limited to, magnetic switches and sensors, inductive switches and sensors, and optical proximity sensors that detect when an object is nearby. Magnetic switches and sensors include reed switches and Hall effect sensors that detect changes in magnetic field caused by a nearby object. Inductive switches and sensors detect changes in inductance due to the presence of a nearby object. Optical proximity sensors include infrared sensors that detect a nearby object disturbing reflected infrared light.

The load disconnector 18 may further include a load disconnect relay 22 that is disposed in an electrical current pathway 24 between the power supply 12 and the load 14, and is controlled by the load disconnect switch 20. In FIG. 1, the load disconnect relay 22 may be implemented using a solid state relay (SSR). An electromechanical relay could also be used. The load disconnect relay 22 has a switchable power side 22A that is directly connected to the current pathway 24 (power circuit pathway) and a control side 22B that is connected to the load disconnect switch 20. The power side 22A switches power from the power supply 12 to the load 14 and thus is capable of handling the full current drawn by the load. The control side 22B is connected between the power circuit pathway 24 and the return side 25 of power supply 12 in an electrical current pathway 26 (control circuit pathway), but operates at a much lower current due to resistor R1. Note that the orientation of the diode within the load disconnect relay 22 is due to the power supply 12 return side being positive and the supply side being negative in the embodiment of FIG. 1. In other embodiments, a power supply of opposite polarity might be used. Because the load disconnect switch 20 is connected to control circuit pathway 26, it may be implemented using a low-current switching or sensing device. The power side 22A of the load disconnect relay 22 will be closed as long as current flows through the control side 22B, thereby allowing power to flow from the power supply 12 to the load 14. Opening the load disconnect switch 20 opens the circuit on the control side 22B, causing the power side 22B to switch to its open state to disconnect the power supply 12 from the load 14.

The load disconnector 18 also includes a load disconnect actuating mechanism that may be located for access from either inside or outside of the enclosure housing, depending on design requirements. In FIG. 1, the load disconnect actuating mechanism is implemented by a power cutoff switch mechanism 28 that includes a handle 28A mounted on the service entrance door 8. In other embodiments, a load disconnect actuating mechanism could be implemented separately from a power cutoff mechanism, such that there are two actuating mechanisms having separate handles. This would allow service personnel to independently shutoff main power and/or disconnect the load, depending on operational needs.

The power cutoff switch mechanism 28 is positionable between a power-on state (handle up) and a power-off state (handle down). When the service entrance door 8 is closed, the power cutoff switch mechanism 28 will operatively engage a main power breaker 30 located on the service panel 10. The main power breaker 30 connects to one or more load distribution breakers 32 that supply main power to one or subsidiary load circuits, including a circuit 34 that includes the power supply 12. The main breaker 30 includes a main power breaker toggle switch 30A and is operable to selectively activate and deactivate the delivery of main power to the one or more load distribution breakers 32, and hence to the power supply 12. Using the main power breaker toggle switch 30A, the main power breaker 30 can be positioned between a power-on state and a power-off state.

The power cutoff switch mechanism 28 operates the main power breaker 30 by mechanically engaging the main breaker toggle switch 30A in a suitable manner. One example of how such mechanical engagement may be implemented is described below in connection with FIG. 2 et seq. In some embodiments, the power cutoff switch mechanism 28 may be constructed so that it only switches off the main power breaker 30 but cannot switch it back on. In other embodiments, the power cutoff switch mechanism 28 may be constructed so that it can switch the main power breaker 30 both on and off. Advantageously, the power cutoff switch mechanism 28 is operable from outside the service entrance door 8 (via the handle 28A). Thus, the main power breaker toggle switch 30A can be deactivated to cutoff main power without opening the service entrance door 8. The power cutoff switch mechanism 28 is also operatively connected to the load disconnect switch 20 in manner that causes the load disconnector 18 to disconnect the load 14 from the power supply 12 when the power cutoff switch mechanism is positioned in the power-off state.

In FIG. 1, the power cutoff switch mechanism 28 thus also serves as a load disconnect actuating mechanism, as mentioned above. There are many ways that the power cutoff switch mechanism 28 can interact with the load disconnect switch 20 to activate the load disconnector 18. The selected configuration will depend on the nature of the load disconnect switch 20 and other factors. One example embodiment is described below in connection with FIG. 2 et seq.

If desired, the power cutoff switch mechanism 28 may also operatively engage an optional generator power breaker 36 that includes a generator power breaker toggle switch 36A. The generator power breaker 36 is operatively connected to an optional generator 38 that may be used to deliver generator power to the one or more load distribution breakers 32 in the event of a main power cutoff. When the service entrance door 8 is closed, the power cutoff switch mechanism 28 will engage the generator power breaker toggle switch 36A in a suitable manner. Preferably, both the main power breaker 30 and the generator power breaker 36 will be powered off simultaneously when the power cutoff switch mechanism is positioned to its power off state. This functionality is provided by the example embodiment is described below in connection with FIG. 2 et seq.

Turning now to FIG. 1A, a modification of the enclosure 2 is shown wherein the power supply 12 powers plural loads, such as loads 14-1 and 14-2. In this embodiment, there are two power circuit pathways 24-1 and 24-2 respectively delivering power to each load 14A and 14B. The load disconnector 18 consequently includes two load disconnect relays 22-1 and 22-2. However, only one load disconnect switch 20 is needed to control both load disconnect relays 22-1 and 22-2. Apart from the fact that the load disconnect switch 20 controls two load disconnect relays in stead of one, the operational features of the load disconnector 18 are the same as those described above in connection with FIG. 1. Note that FIG. 1A omits certain components shown in FIG. 1 (such as the service panel, generator and door components) due to space limitations.

Turning now to FIG. 1B, a further modification of the enclosure 2 is shown wherein the load disconnect switch 20 of the load disconnector 18 is connected directly to the power circuit pathway 24 without the relay 22 of FIG. 1. For this application, the load disconnect switch 20 must be capable of handling the full current drawn by the load 14, which may be disadvantageous for some applications. Apart from the fact that the load disconnect switch 20 directly switches power to the load 14, the operational features of the load disconnector 18 are the same as those described above in connection with FIG. 1.

Figure 2:
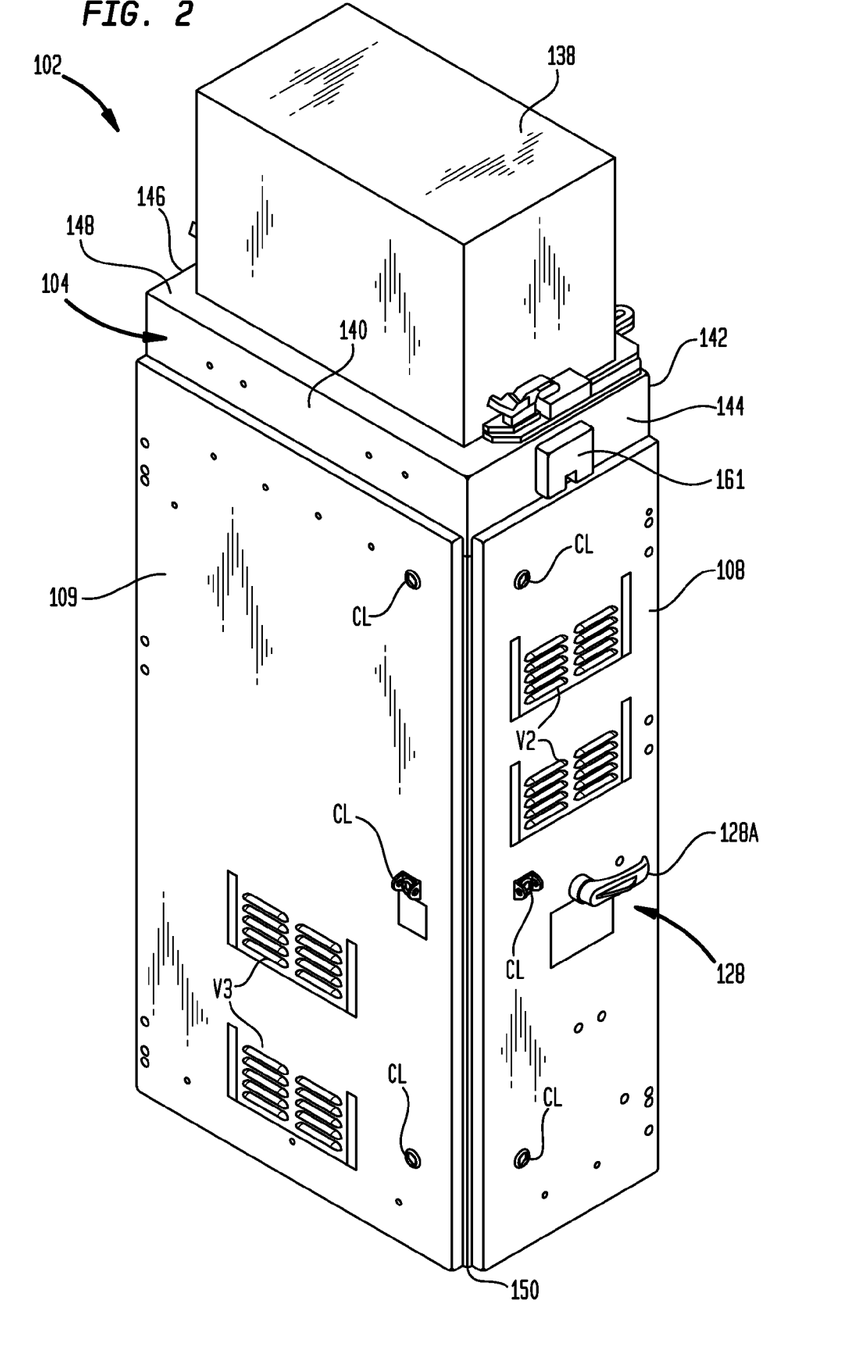
FIG. 2 is a perspective view showing the exterior of an example embodiment of the panelboard enclosure of FIG. 1.
Figure 3:
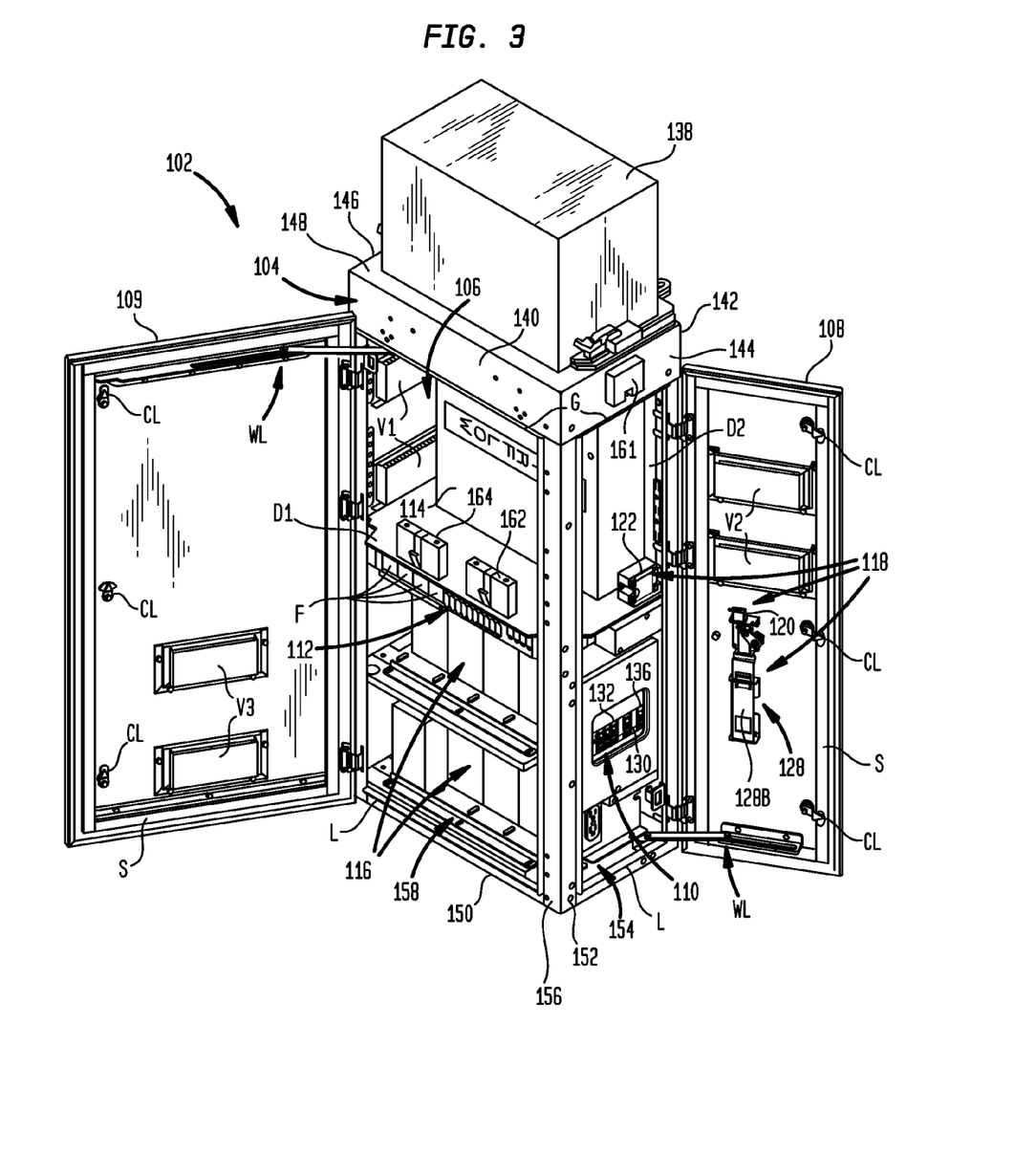
FIG. 3 is a perspective view showing the interior of the panelboard enclosure embodiment of FIG. 2.

Turning now to FIGS. 2-3, an example panelboard enclosure embodiment 102 is shown in order to illustrate one possible application of the panelboard enclosure 2 of FIG. 1. The panelboard enclosure 102 is designed for outdoor use at an electrical equipment site, namely, a base station subsystem (BSS) comprising the panelboard enclosure and a cellular telephone antenna tower. In this application, the primary function of the panelboard enclosure 102 is to power a radio transceiver that handles wireless voice and data communications in a cellular telephone network. Most of the components illustrated in the panelboard enclosure 2 of FIG. 1 find correspondence in the panelboard enclosure 102 of FIGS. 2-3. This correspondence between components is indicated by the use of corresponding reference numbers, with the reference numbers of FIGS. 2-3 being incremented by 100.

The panelboard enclosure 102 thus includes an enclosure housing 104 having an interior equipment chamber 106 (see FIG. 3) that can be accessed via a first service entrance door 108 located on a first side of the enclosure housing 104. A second service entrance door 109 is provided on a second side of the enclosure housing 104 to provide additional access to the interior equipment chamber 106. A service panel 110 is located behind the first service entrance door 108. A rectifying power supply 112 is located behind the second service entrance door 109. The power supply 112 receives 120 V AC utility power and converts it to 48 V DC in order to power a radio transceiver that represents a load 114. Although FIG. 3 shows only a single radio, there is room in the enclosure 104 next to the illustrated radio to mount an additional radio if desired. Two battery arrays located behind the second service entrance door 109 provide a backup power source 116 that delivers 48 V DC to the power supply 112. A load disconnector 118 is provided by a load disconnect switch 120, a load disconnect relay 122 and a power shutoff switch mechanism 128. A main power breaker 130, a service breaker 132 and a generator power breaker 136 are all located on the service panel 110. A generator 138 is mounted on top of the enclosure housing 104. The components of FIG. 1 that are not shown in FIGS. 2-3 are the wiring elements 24, 26 and 34. These elements have been omitted for ease of illustration.

The enclosure housing 102 is generally box-shaped and is formed with a front 140, a back 142, a right side 144, a left side 146, a top 148 and a bottom 150. Other enclosure shapes may also be used. It will be appreciated that the structural members of the enclosure housing 104 can be made from any suitable material that is relatively rigid and strong, including sheet metal (e.g., steel) or a non-metallic material such as plastic or a composite. The right side 144 is provided with a bezel frame 152 that defines a right-side opening 154. The right-side opening 154 allows access to the right side of the interior equipment chamber 106. The front 140 is provided with a bezel frame 156 that defines a front opening 158. The front opening 158 allows access to the front of the interior equipment chamber 106. The first service entrance door 108 is pivotally mounted on the right side 144 of the enclosure housing 104 and is positionable between a closed position wherein the right-side opening 154 is covered (see FIG. 2) and an open position wherein the right-side opening is exposed (see FIG. 3). Similarly, the second service entrance door 109 is pivotally mounted on the front 140 of the enclosure housing 104 and is positionable between a closed position wherein the front opening 158 is covered (see FIG. 2) and an open position wherein the front opening is exposed (see FIG. 3).

In order to help seal the equipment chamber 106 from the elements, the bezel frames 152 and 156 may each be formed with peripheral lip L whose upper horizontal portion is shaped to provide a drip gutter G. As can be seen in FIG. 3, each service entrance door 108 and 109 may be provided with a peripheral seal S made of soft resilient material (e.g., foam weather stripping) that engages the peripheral lip L of its associated opening when the door is closed.

Figure 4:
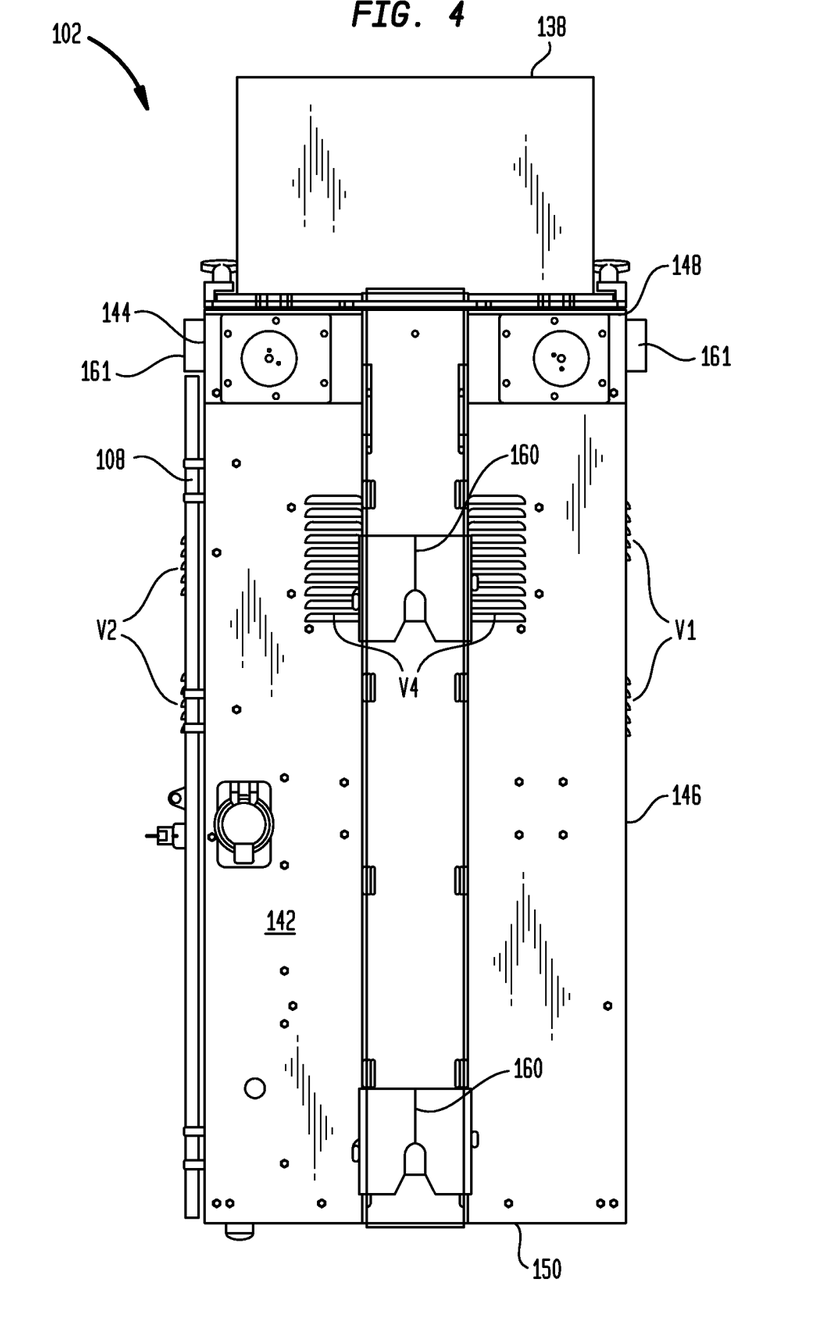
FIG. 4 is a rear elevation view of the panelboard enclosure embodiment of FIG. 2.

As additionally shown in FIG. 4, one or more mounting brackets 160 may be provided on the back 142 of the enclosure housing 104 to facilitate attaching the panelboard enclosure 102 to a mounting structure, such as a utility pole, a framework, a wall, etc. Alternatively, or in addition, mounting apertures (not shown) may be drilled, cut or otherwise formed in the back 142. A pair of lifting tabs 161 (see FIGS. 3 and 4) may be provided on the sides 144 and 166 of the enclosure housing 104 in the event that the panelboard enclosure 102 needs to be hoisted high up on a utility pole. According to a further mounting scheme, the bottom 150 of the enclosure housing 104 may be seated on a plinth (not shown) that is mounted on a support base (not shown).

Returning now to FIGS. 2 and 3, the service entrance doors 108 and 109 can be locked in their closed position using one or more key-activated cam locks CL. The number of cam locks will typically depend on the size of the enclosure 102 and/or applicable electrical code specifications. Three such cam locks are shown in FIGS. 2 and 3 for each of the service entrance doors 108 and 109. The cam locks CL may be formed with a security lock pattern (such as an undulating groove) that requires a corresponding security key. As shown in FIG. 3, wind latch mechanisms WL limit pivoting of the service entrance doors 108 and 109 and allow them to be locked in the open position.

In order to cool the load (radio) 114, a left-right airflow pathway is provided within the enclosure housing 104 using strategically placed air vents V1 and V2 that are respectively located on the left side 146 of the enclosure housing 104 and on the first service entrance door 108. This load cooling pathway is a straight-line path between the vents V1 and the vents V2, with bi-directional air movement being provided by passive air flow delivered from the outside environment. A separate fore-aft airflow pathway is provided for cooling the power supply 112. This power supply cooling pathway is provided using strategically placed air vents V3 and V4 that are respectively located on the second service entrance door 109 and the back 142 of the enclosure housing 104 (see FIG. 4). Unidirectional air movement from the vents V3 to the vents V4 is provided by fans F that are integrated within the power supply 112.

The power supply cooling pathway is isolated from the load cooling pathway by a pair of divider plates D1 and D2. The divider plate D1 is a horizontal shelf member whose top side supports the load 114 and whose lower side mounts the power supply 112. The divider plate D2 is a vertical radio mount that is used to secure the rear side of the load 114. The vertical divider plate D2 is spaced from the back 142 of the enclosure housing 104. The bottom edge of the vertical divider plate is secured to the horizontal divider plate's rear edge, which is also spaced from the back 142 of the enclosure housing 104. This creates a narrow plenum behind the vertical divider plate D2 that provides air communication between the rear air vent V4 and the area below the horizontal divider plate D1. The load cooling pathway is above the horizontal divider plate D1 and in front of the vertical divider plate D2. The power supply cooling pathway is below horizontal divider plate D1 and behind the vertical divider plate D2.

As can be seen in FIG. 3, the back of each vent V1, V2, V3 and V4 may be constructed with a bracket that carries a filter element (not shown) in order to provide air filtration. In addition, the enclosure housing 104 could be provided with a heat exchanger, an air conditioner or other system (not shown) that provides temperature and humidity control within the panelboard enclosure 102.

In order to support the cellular communication functions of the panelboard enclosure 102, the enclosure is provided with a media converter 162 (see FIG. 3) that may be mounted on a shelf within the enclosure housing 104. The media converter 162 is electrically connected on one side to a first wireline communications medium (not shown) extending to the load (radio) 114 and on the other side to a second wireline communications medium (not shown) extending to a remote site (such as a mobile switching center (MSC)). By way of example, the first communications medium could a Gigabit Ethernet cord and the second communications medium could be an SC fiber optic cable. A step down transformer 164 is connected to the power supply and 112 and supplies 12V DC to the media converter 162.

As will be described in more detail below, the load disconnect switch 120 is a plunger-style switch that is mounted to the inside of the first service entrance door 108 (see FIG. 3). The load disconnect switch 120 could also be mounted at other locations on the first entrance door 108. It could also be mounted on the service panel 110 or elsewhere within the enclosure housing 104. The load disconnect relay 122 is an SSR and may be mounted at any convenient location within the enclosure housing 104. It could also be mounted on the first service entrance door 108. The power shutoff switch mechanism 128 comprises a handle 128A on the outside of the service entrance door 108 (see FIG. 2) and a main breaker actuating mechanism 128B on the inside of the service entrance door (see FIG. 3).

Figure 5:
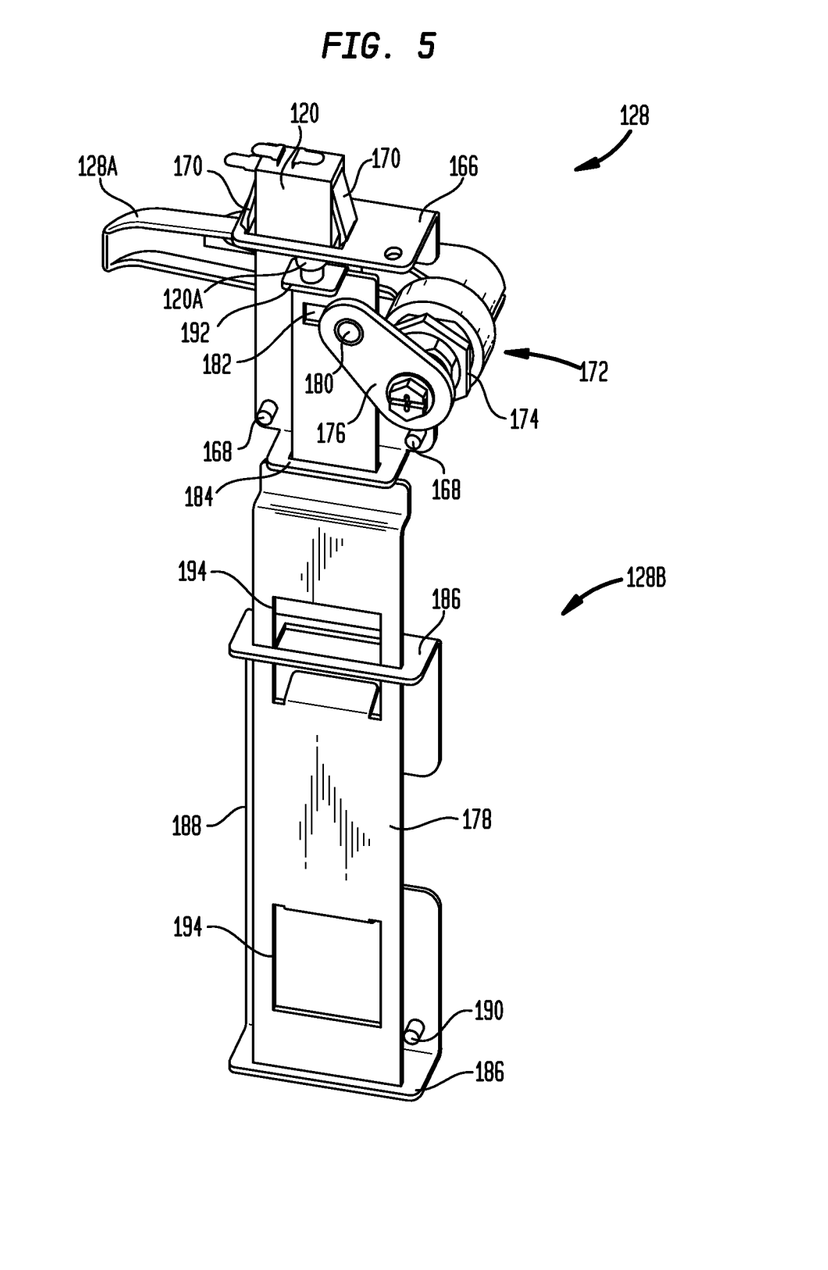
FIG. 5 is a perspective view showing a power cutoff switch mechanism of the panelboard enclosure embodiment of FIG. 2.

Further details of the power shutoff switch mechanism 128 and the load disconnect switch 120 are shown in FIG. 5. In this embodiment, the load disconnect switch 120 is mounted to the first service entrance door 108 (not shown in FIG. 5) by way of a switch mounting bracket 166. The switch mounting bracket 166 can be riveted or otherwise attached to the entrance door using rivets or other types of fasteners 168 (not all of which are shown). The load disconnect switch 120 is seated in an aperture on an upper flange of the switch mounting bracket and is retained therein by spring clips 170. The downwardly extending plunger portion of the load disconnect switch 120 is designated by reference number 120A. The load disconnect switch 120 is normally open due to the switch plunger 120A being biased to a downwardly extended position. However, the switch plunger 120A is held closed by the power shutoff switch mechanism 128 when the latter is in its power-off state.

The power shutoff switch mechanism 128 includes a rotatable hub assembly 172 that extends through an aperture (not shown) in the first service entrance door 108 and connects the handle 128A to the main breaker actuating mechanism 128B. The hub assembly 128C may be secured to the first service entrance door 108 using a conventional backing nut 174. The inner end of the hub assembly 172 mounts a crank arm 176. The free end of the crank arm 176 is coupled to a slidable switch bar 178 by way of a cam follower pin 180 that operatively engages a cam slot 182 (providing a cam surface) at the upper end of the switch bar. This arrangement serves to linearly drive the switch bar 178 up and down when the handle 128A, the hub assembly 172 and the crank arm 176 are rotated.

The switch bar 178 is slidably mounted to the inside of the first service entrance door 108 using an upper mounting bracket 184 (formed as part of the switch mounting bracket 166) and a pair of lower mounting brackets 186 formed on a common base member 188. The base member 188 can be riveted or otherwise attached to the entrance door using rivets or other types of fasteners 190 (not all of which are shown). Each of the mounting brackets 184 and 186 is formed with a slot in which the switch bar 178 is slidably disposed.

The upper end of the switch bar 178 is formed with a switch actuator 192 that engages and depresses the switch switch plunger 120A when the power shutoff switch mechanism 128 is its power-on state. This closes the load disconnect switch 120, activates the load disconnect relay 122, and allows power to flow from the power supply 112 to the load 114. FIG. 5 illustrates the power shutoff switch mechanism 128 in its power-on state. In this position, the handle 128A is in its raised position extending horizontally. Rotating the handle 128A downwardly 90 degrees drives the switch bar 178 down and places the power shutoff switch mechanism 128 in its power-off state. Lowering the switch bar 178 retracts the switch actuator 192 from the switch plunger 120A, allowing it to bias to its downwardly extended position (not shown in FIG. 5). This opens the load disconnect switch 120, deactivates the load disconnect relay 122 and disconnects power supply 112 from the load 114. At the same time, the power shutoff switch mechanism 128 also shuts off the main power breaker 130 (and optionally the generator power breaker 136). To effect this operation, the switch bar 178 is formed with a pair of slot apertures 194 that engage certain structure associated with the service panel 110, as described in more detail below.

Figure 6:
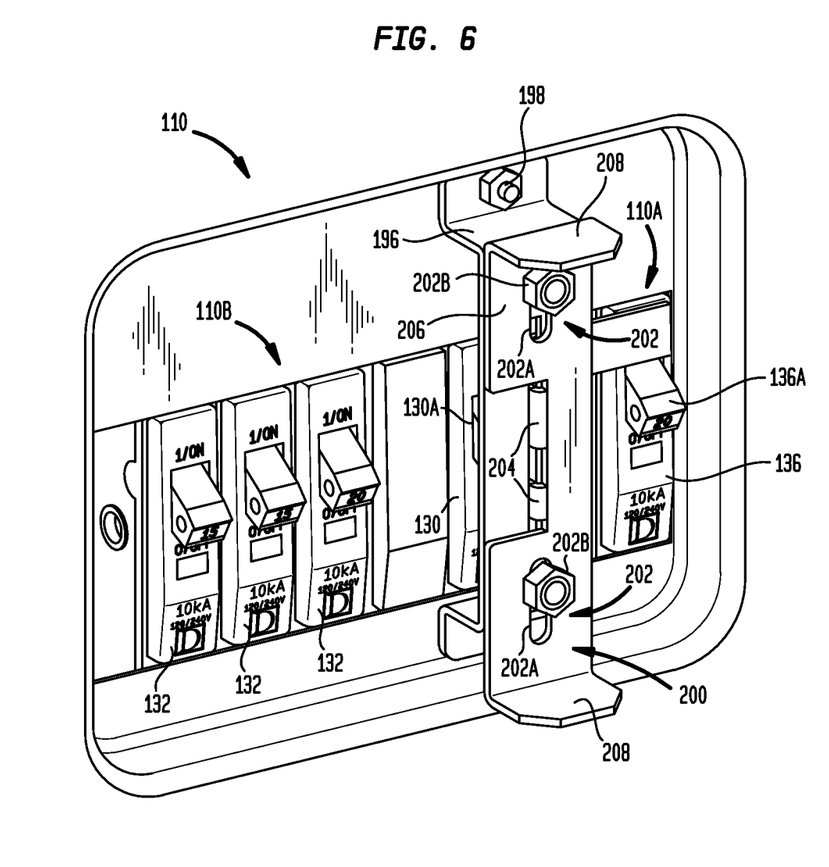
FIG. 6 is a perspective view showing a service panel of the panelboard enclosure embodiment of FIG. 2 that includes main power breaker and a main breaker position indicator.

Turning now to FIG. 6, the service panel 110 comprises both a primary service panel 110A and a distribution service panel 110B. The primary service panel 110A includes the main power breaker 130 that is adapted for connection to a main power source (not shown) such as a municipal power utility. As can be partially seen in FIG. 6, the main power breaker 130 includes a main power breaker toggle switch 130A. The primary service panel 110A also includes generator power breaker 136 that is operably connected to the generator 138 shown in FIGS. 2-4. The generator power breaker 136 includes a generator power breaker toggle switch 136A. The distribution panel 110B is connected to receive main power from the primary service panel 110A and distribute such power to one or more subsidiary load circuits (not shown). The distribution panel 110B includes three circuit breakers 132, including a 20 Amp breaker that may be used to supply main power (or generator power) to the power supply 112. Additional circuit breakers could be added if desired.

FIG. 6 further illustrates the addition of a mounting bracket 196 that is not shown in any of the previous drawing figures. The mounting bracket 196 can be bolted or otherwise attached to the service panel 110 using bolts or other types of fasteners 198. Attached to the mounting bracket 196 is a main breaker position indicator 200. The main breaker position indicator 200 is slideably mounted for vertical movement on the mounting bracket 196 using a bolt-and-slot arrangement 202. In this bolt-and-slot arrangement, the main breaker position indicator 200 is provided with a pair of vertical slots 202A that slide up and down on a pair of bolts or other fasteners 202B mounted to the mounting bracket 196. The main breaker position indicator 200 also includes main breaker actuation components that actuate the main power breaker 130 and the generator power breaker 136.

To operate the main power breaker 130, the main breaker actuation components include a pair of upper and lower actuating tabs 204 that respectively engage the upper and lower sides of the main power breaker toggle switch 130A. Up and down movement of the main breaker position indicator 200 will manipulate the main power breaker toggle switch 130A so that the main power breaker 130 is transitioned between its power-on state and its power-off state. To operate the generator power breaker 136, the main breaker actuation components include a lateral actuating lever 206 that engages the upper side of the generator power breaker toggle switch 136A. Downward movement of the main breaker position indicator 200 will manipulate the generator power breaker toggle switch 136A so that the generator power breaker 136 is transitioned between from its power-on state to its power-off state. Up and down movement of the main breaker position indicator 200 is provided by the switch bar 178 of the power cutoff switch mechanism 128 as the handle 128A is actuated from the front of the first service entrance door 108. The manner in which the switch bar 178 engages the main breaker position indicator 200 will now be described.

Figures 7A, 7B:
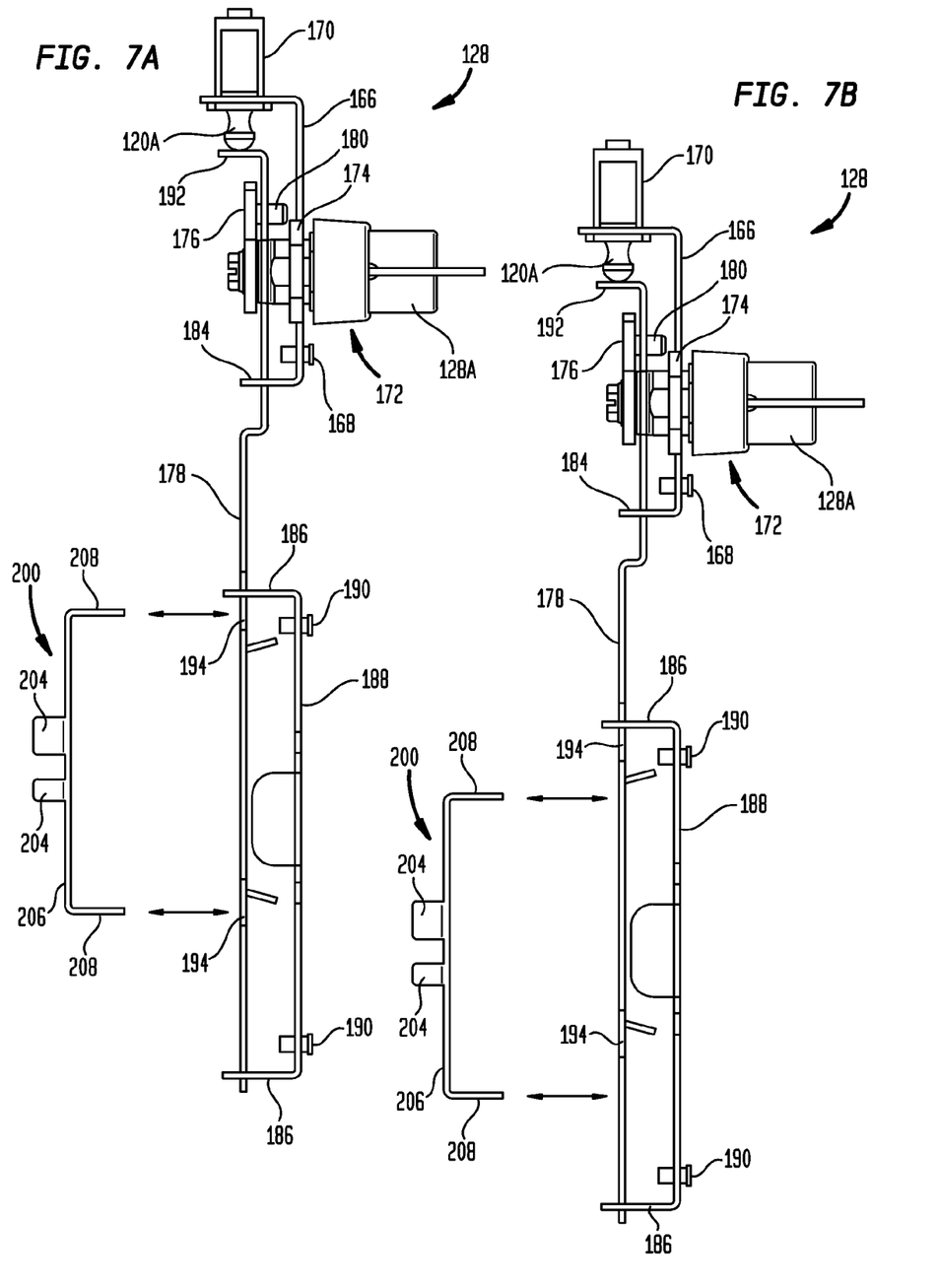
FIG. 7A is a perspective view showing an aligned position of a power cutoff switch mechanism and a main breaker position indicator of the panelboard enclosure embodiment of FIG. 2.
FIG. 7B is a perspective view showing an offset position of a power cutoff switch mechanism and a main breaker position indicator of the panelboard enclosure of FIG. 21.

As can be seen in FIG. 6, the main breaker position indicator 200 is formed with a generally flat main body portion 206 having a pair of outwardly extending rigid flanges 208 at each end. The flanges 208 are located and sized to engage the slot apertures 194 (see FIG. 5) of the power cutoff switch mechanism's switch bar 178 in nested engagement when the switch bar is properly aligned with the main breaker position indicator 200. This alignment position is shown in FIG. 7A. In this figure, the power cutoff switch mechanism 128 is in a position that represents its power-on state and the main breaker position indicator 200 is in a position that represents the power-on state of the main power breaker 130 (and the generator power breaker 136). Although not shown, proper alignment between the slidable switch bar 178 and the main breaker position indicator 200 will also be achieved when the power cutoff switch mechanism 128 and the main power breaker 130 (as well as the generator power breaker 136) are both in the power-off state. It will be appreciated that the nested engagement that results when the main breaker position indicator 200 is aligned with the switch bar 178 allows the latter to actuate the former and thereby operate the main power breaker 130 (and the generator power breaker 136).

If the slidable switch bar 178 and the main breaker position indicator 200 are not aligned, the flanges 208 will not engage the slot apertures 194 and will instead hit against a non-apertured portion of the switch bar 178. This non-aligned or offset position is shown in FIG. 7B. In this figure, the power cutoff switch mechanism 128 is in a position that represents its power-on state and the main breaker position indicator 200 is in a position that represents the power-off state of the main power breaker 130 (and the generator power breaker 136). Although not shown, misalignment between the slidable switch bar 178 and the main breaker position indicator 200 will also result when the power cutoff switch mechanism 128 is in the power-off state and the main power breaker 130 (as well as the generator power breaker 136) is in the power-on state.

Proper engagement of the flanges 208 of the main breaker position indicator 200 into the slot apertures 194 of the switch bar 178 is required in order to close and latch the first service entrance door 108 on which the power cutoff switch mechanism 128 is mounted, and also to allow the power cutoff switch mechanism to operate the main power breaker 130 (and the generator power breaker 136). If there is misalignment, the height of the flanges 128 is such that the first service entrance door 108 will not be fully closable when the flanges hit against the non-apertured portion of the switch bar 178. This provides a lockout system that is operable to prevent the first service entrance door 108 from being secured in its closed position unless the power cutoff switch mechanism 128 and the main power breaker 130 (as well as the generator power breaker 136) are in the same state. The switch bar 178 represents a first lockout component associated with the power cutoff switch mechanism 128 and the main breaker position indicator 200 represents a second lockout component associated with the main power breaker 130 (and with the generator power breaker 136). The first lockout component and the second lockout component are configured for nested engagement with each other when the power cutoff switch mechanism 128 and the main power breaker 130 (as well as the generator power breaker 136) are in the same state. Conversely, the first lockout component and the second lockout component are configured for non-nested engagement with each other when the power cutoff switch mechanism 128 and the main power breaker 130 (as well as the generator power breaker 136) are not in the same state.

Although not shown, it will be appreciated that other panelboard enclosure embodiments could be implemented without a lockout system. In such embodiments, the power cutoff switch mechanism 128 would perform all of the functions described above, but would not necessarily prevent the first service entrance door 108 from being closed without the power cutoff switch mechanism and the main power breaker 130 (as well as the generator power breaker 136) being in the same state.

As previously mentioned, the power shutoff switch mechanism 128 is operable from outside the first service entrance door 108 to mechanically engage and deactivate a main power breaker toggle switch 130A (as well as the generator power breaker toggle switch 136A) and cutoff main power (and generator power) without having to open the first service entrance door. This capability is useful for utility workers as well as fire crews or other emergency personnel who may not have a key for opening the first service entrance door 108. Advantageously, actuating the power shutoff mechanism 128 will also open the load disconnect switch 120 to disconnect the power supply 112 from the load 114, such that neither main power, generator power nor backup power can reach the load 114. Thus, personnel working in and around the panelboard enclosure 102 will not be subject to a live load, which in the case of a radio load means they will not be exposed to RF radiation. With the simple throw of the handle 128A, all power to the load 114, including battery backup power, can be disabled, thereby increasing the safety factor for on-site personnel working in or around the panelboard enclosure 102.

Accordingly, an electrical panelboard enclosure with a manually operable load disconnector has been disclosed. Although various embodiments have been described, it should be apparent that many variations and alternative embodiments could be implemented in accordance with the inventive concepts disclosed herein. For example, the design of the panelboard enclosure embodiment 102 could be modified by rearranging the components therein, such as by relocating the service panel 110 behind the second service entrance door 109 instead of behind first service entrance door 108. In that case, the power shutoff mechanism 128 and the load disconnect switch 120 could be mounted on the second service entrance door 109. The panelboard enclosure 102 could also be modified by eliminating one of the service entrance doors, such that there is only one. It is understood, therefore, that the invention is not to be in any way limited except in accordance with the spirit of the appended claims and their equivalents.

What is claimed is:

1. An electrical panelboard enclosure, comprising:
   an enclosure housing having an interior equipment chamber accessible via an opening in said housing;
   a service entrance door mounted on said housing and positionable between a closed position wherein said opening is covered and an open position wherein said opening is exposed;
   a service panel in said equipment chamber adapted for connection to a main power source to receive main power therefrom;
   a power supply in said equipment chamber operatively connected to receive said main power from said service panel and deliver it to a load;
   said power supply being adapted for connection to a backup power source to receive backup power therefrom and deliver it to said load; and
   a load disconnector operatively connected between said power supply and said load, said load disconnector being manually operable to disconnect said load from said power supply to prevent said power supply from delivering power to said load.

2. The panelboard enclosure of claim 1, wherein load disconnector comprises a load disconnect switch selected from the group consisting of mechanical switches and sensors, optical switches and sensors, and proximity switches and sensors.

3. The panelboard enclosure of claim 1, wherein said load disconnector comprises a load disconnect switch and a load disconnect relay disposed in an electrical current pathway between said power supply, said load disconnect relay being controlled by said load disconnect switch.

4. The panelboard enclosure of claim 1, wherein said load disconnector comprises a load disconnect actuating mechanism that is accessible from outside said enclosure housing.

5. The panelboard enclosure of claim 4, wherein said load disconnect actuating mechanism is mounted on said service entrance door.

6. The panelboard enclosure of claim 1, further including:
   a main power breaker in said equipment chamber having a main power breaker toggle switch operable to selectively activate and deactivate delivery of said main power to said power supply, said main power breaker being positionable between a power-on state and a power-off state;
   a power cutoff switch mechanism operable from outside said service entrance door to mechanically engage and deactivate said main power breaker toggle switch and cutoff said main power without opening said service entrance door, said power cutoff switch mechanism being positionable between a power-on state and a power-off state; and
   said load disconnector being operable by said power cutoff switch mechanism to disconnect said load from said power supply when said power cutoff switch mechanism is positioned in said power-off state, whereby said power cutoff switch mechanism also serves as a load disconnect actuating mechanism.

7. The panelboard enclosure of claim 6, wherein said load disconnector employs a switching or sensing technology that allows said load disconnector to respond to said power cutoff switch mechanism being in said power-off state, said switching or sensing technology being selected from the group consisting of mechanical switching or sensing, optical switching or sensing, and proximity switching or sensing.

8. The panelboard enclosure of claim 6, wherein said power cutoff switch mechanism is mounted on said service entrance door.

9. The panelboard enclosure of claim 1, wherein said load is disposed in said interior equipment chamber of said enclosure housing.

10. The panelboard enclosure of claim 1, wherein said backup power source is disposed in said interior equipment chamber of said enclosure housing.

11. An electrical panelboard enclosure, comprising:
    an enclosure housing having an interior equipment chamber accessible via an opening in said housing;
    a service entrance door mounted on said housing and positionable between a closed position wherein said opening is covered and an open position wherein said opening is exposed;
    a service panel in said equipment chamber adapted for connection to a main power source to receive main power therefrom;
    a power supply in said equipment chamber operatively connected to receive said main power from said service panel and deliver it to a load;

said power supply being adapted for connection to a backup power source to receive backup power therefrom and deliver it to said load;

a main power breaker in service panel having a main power breaker toggle switch operable to selectively activate and deactivate delivery of said main power to said power supply, said main power breaker being positionable between a power-on state and a power-off state;

a power cutoff switch mechanism operable from outside said service entrance door to mechanically engage and deactivate said main power breaker toggle switch and cutoff said main power without opening said service entrance door, said power cutoff switch mechanism being positionable between a power-on state and a power-off state; and a load disconnector operatively connected between said power supply and said load, said load disconnector being manually operable by said power cutoff switch mechanism to disconnect said load from said power supply to prevent said power supply from delivering power to said load.

12. The panelboard enclosure of claim 11, wherein load disconnector comprises a load disconnect switch selected from the group consisting of mechanical switches and sensors, optical switches and sensors, and proximity switches and sensors.

13. The panelboard enclosure of claim 11, wherein said load disconnector comprises a load disconnect switch and a load disconnect relay disposed in a current pathway between said power supply and said load disconnect relay being controlled by said load disconnect switch.

14. The panelboard enclosure of claim 13, wherein said power cutoff switch mechanism serves as a load disconnect actuating mechanism of said load disconnector that is accessible from outside said enclosure housing.

15. The panelboard enclosure of claim 11, wherein said power cutoff switch mechanism is mounted on said service entrance door.

16. The panelboard enclosure of claim 11, wherein said load disconnector is operable to disconnect said load in response to said power cutoff switch mechanism being positioned in said power-off state.

17. The panelboard enclosure of claim 11, wherein said power cutoff switch mechanism comprises a handle mounted on an outside of said service entrance door and a main power breaker toggle switch actuating mechanism on an inside of said service entrance door.

18. The panelboard enclosure of claim 11, wherein said load is disposed in said interior equipment chamber of said enclosure housing.

19. The panelboard enclosure of claim 11, wherein said backup power source comprises one or more batteries disposed in said interior equipment chamber of said enclosure housing.

20. The panelboard enclosure of claim 11, wherein said enclosure housing is vented and divided to provide a first airflow pathway for cooling said load and a second airflow pathway for cooling said power supply, said first and second airflow pathways being isolated from each other.

21. An electrical panelboard enclosure comprising:

an enclosure housing having an interior equipment chamber accessible via at least one opening in said housing;

at least one service entrance door mounted on said housing and positionable between a closed position wherein said at least one opening is covered and an open position wherein said opening is exposed;

a service panel in said equipment chamber adapted for connection to a main power source to receive main power therefrom;

a power supply in said equipment chamber operatively connected to receive said main power from said service panel and deliver it to a load is disposed in said interior equipment chamber of said enclosure housing;

said power supply being adapted for connection to a backup power source comprising one or more batteries to receive backup power therefrom and deliver it to said load;

a main power breaker in service panel having a main power breaker toggle switch operable to selectively activate and deactivate delivery of said main power to said power supply, said main power breaker being positionable between a power-on state and a power-off state;

a power cutoff switch mechanism operable from outside said at least one service entrance door to mechanically engage and deactivate said main power breaker toggle switch and cutoff said main power without opening said service entrance door, said power cutoff switch mechanism being positionable between a power-on state and a power-off state;

a load disconnector operatively connected between said power supply and said load, said load disconnector being manually operable from outside said at least one service entrance door to disconnect said load from said power supply to prevent said power supply from delivering power to said load;

said load disconnector comprising a load disconnect switch selected from the group consisting of mechanical switches and sensors, optical switches and sensors, and proximity switches and sensors;

load disconnector further comprising a load disconnect relay disposed in a current pathway between said power supply and said load disconnect relay being controlled by said load disconnect switch; and said load disconnector further comprising a load disconnect actuating mechanism that is operable from outside said enclosure housing.

22. The panelboard enclosure of claim 21, wherein said power cutoff switch mechanism serves as said load disconnect actuating mechanism and actuates said load disconnect switch so that said load disconnector disconnects said load in response to said power cutoff switch mechanism being positioned in said power-off state.

* * * * *